(12) United States Patent
Kale et al.

(10) Patent No.: US 11,296,729 B2
(45) Date of Patent: Apr. 5, 2022

(54) DATA RELIABILITY FOR EXTREME TEMPERATURE USAGE CONDITIONS IN DATA STORAGE

(71) Applicant: Micron Technology, Inc., Boise, ID (US)

(72) Inventors: Poorna Kale, Folsom, CA (US); Christopher Joseph Bueb, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/937,077

(22) Filed: Jul. 23, 2020

(65) Prior Publication Data

US 2022/0029641 A1 Jan. 27, 2022

(51) Int. Cl.
*H03M 13/29* (2006.01)
*H03M 13/35* (2006.01)
*G06F 11/10* (2006.01)
*G11C 16/04* (2006.01)

(52) U.S. Cl.
CPC ..... *H03M 13/2906* (2013.01); *G06F 11/1068* (2013.01); *H03M 13/353* (2013.01); *G11C 16/0483* (2013.01)

(58) Field of Classification Search
CPC ............ H03M 13/2906; H03M 13/353; G06F 11/1068; G11C 16/0483
See application file for complete search history.

(56) References Cited

U.S. PATENT DOCUMENTS

| 7,000,168 | B2 | 2/2006 | Kurtas et al. |
| 8,291,285 | B1 | 10/2012 | Varnica et al. |
| 8,924,815 | B2 | 12/2014 | Frayer et al. |
| 10,474,527 | B1 * | 11/2019 | Sun ..................... G06F 11/1068 |

(Continued)

FOREIGN PATENT DOCUMENTS

KR 10-1684157 12/2016

OTHER PUBLICATIONS

International Search Report and Written Opinion, PCT/US2020/037297, dated Sep. 21, 2020.

(Continued)

*Primary Examiner* — Guy J Lamarre
(74) *Attorney, Agent, or Firm* — Greenberg Traurig

(57) ABSTRACT

Systems, methods, and apparatus related to memory devices such as solid state drives. In one approach, data is received from a host system (e.g., data to be written to an SSD). The received data is encoded using a first error correction code to generate first parity data. A temperature at which memory cells of a storage device (e.g., the SSD) will store the received data is determined. In response to determining the temperature, a first portion of the received data is identified (e.g., data in memory storage that is error-prone at a predicted higher temperature that has been determined based on output from an artificial neural network using sensor(s) input). The identified first portion is encoded using a second error correction code to generate second parity data. The second error correction code has a higher error correction capability than the first error correction code. The encoded first portion, the first parity data, and the second parity data are stored in the memory cells of the storage device.

20 Claims, 7 Drawing Sheets

(56) References Cited

U.S. PATENT DOCUMENTS

| | | |
|---|---|---|
| 2006/0075321 A1 | 4/2006 | Vedantham et al. |
| 2008/0163023 A1* | 7/2008 | Hong ................ H03M 13/2945 |
| | | 714/752 |
| 2013/0305120 A1* | 11/2013 | Torii .................. G06F 11/1044 |
| | | 714/764 |
| 2014/0208186 A1 | 7/2014 | Stek et al. |
| 2015/0043281 A1* | 2/2015 | Hemink .............. G11C 11/5642 |
| | | 365/185.18 |
| 2017/0046221 A1* | 2/2017 | Bandic ................ G06F 11/1044 |
| 2018/0287639 A1 | 10/2018 | Murakami |
| 2019/0140784 A1 | 5/2019 | Xi et al. |
| 2020/0402605 A1 | 12/2020 | Subbarao et al. |

OTHER PUBLICATIONS

Liva, et al. "Pivoting algorithms for maximum likelihood decoding of LDPC codes over erasure channels." IEEE, 2009.

Savin, et al. "Binary linear time erasure decoding for non-binary LDPC codes." IEEE, 2009.

* cited by examiner

DATA RELIABILITY FOR EXTREME TEMPERATURE USAGE CONDITIONS IN DATA STORAGE

FIELD OF THE TECHNOLOGY

At least some embodiments disclosed herein relate to memory devices in general, and more particularly, but not limited to improved data reliability for data storage at elevated temperatures.

BACKGROUND

Various types of non-volatile storage devices can be used to store data. Non-volatile storage devices can include NAND flash memory devices. NAND flash is a type of flash memory constructed using NAND logic gates.

A solid state drive is an example of a non-volatile data storage device that uses solid-state memory to store data in, for example, non-volatile NAND-based flash memory chips. NAND-based flash memories are generally reliable, but do not store data error-free. In some cases, an error correction code is used to correct raw bit errors in the stored data.

Errors in data storage may occur for various reasons. For example, errors may be caused by noise at power rails, voltage threshold disturbances during reading or writing of neighboring cells, or retention loss due to leakage within the cells.

Error correction codes are often used in flash memories to recover stored data if an error is detected. In one example, an error correction code supplements user data with parity bits that store additional information so that the data can be recovered if one or more data bits are corrupted. In general, the number of data bit errors that can be corrected in the store data increases as the number of error bits in the error correction code increases.

In memory devices, the user data is stored in a memory location of the memory device along with the error correction code for the data. This permits the data and error correction code to be written to the memory location in a single write operation, or read from the memory location in a single read operation. Typically, the error correction code is implemented in the flash memory controller.

In one example, the error correction code generates parity bits that are stored with the user data. In various examples, the error correction code is based on a Hamming coding scheme, a Reed-Solomon coding scheme, a turbo code coding scheme, or a low-density parity check (LDPC) coding scheme.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
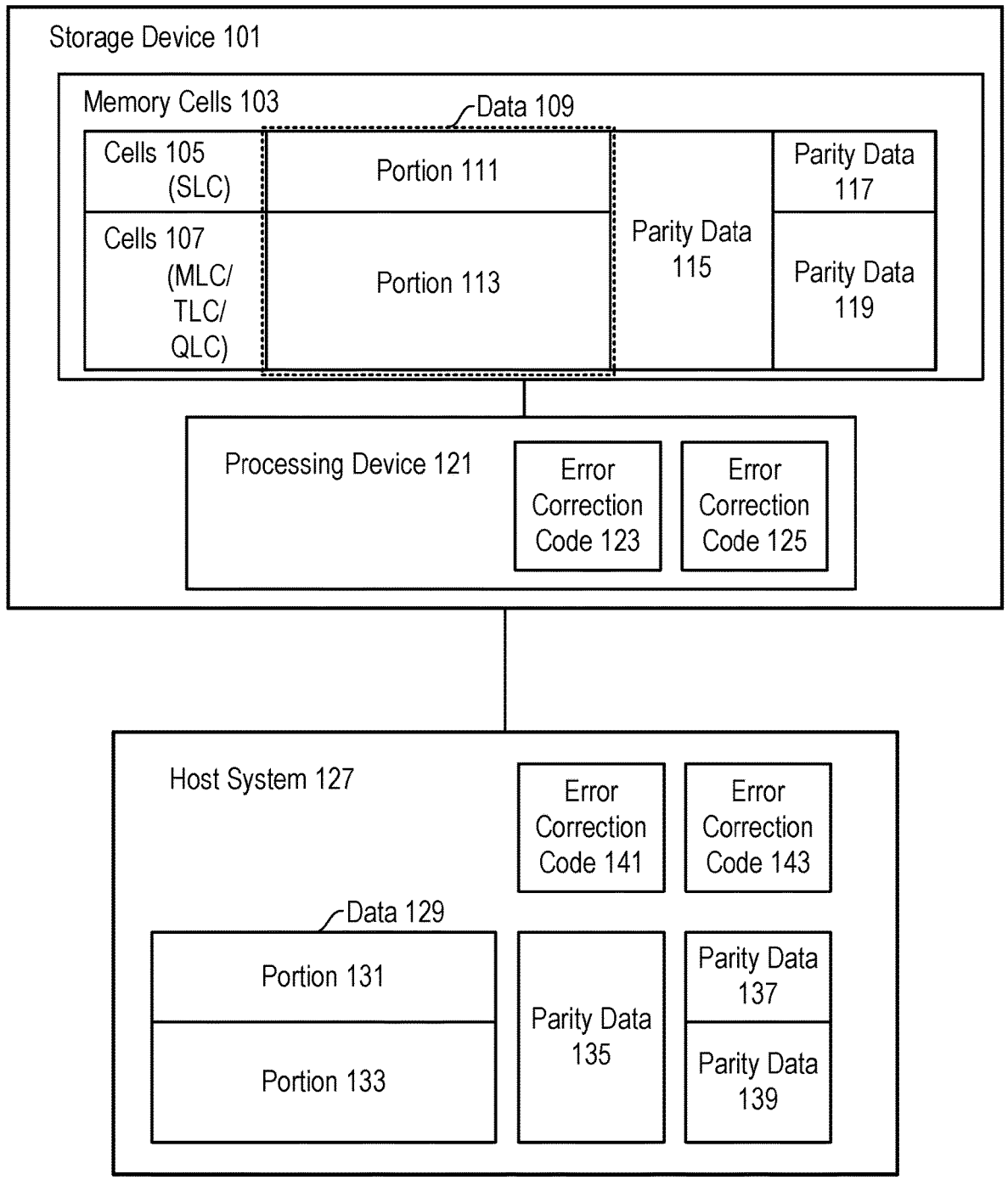
FIG. 1 illustrates a storage device that encodes stored data using two levels of parity data, in accordance with some embodiments.

The following disclosure describes various embodiments for improving data reliability for data storage at elevated temperatures. At least some embodiments herein relate to data stored in a flash memory device based on encoding the data using two levels of parity protection. The memory device may, for example, store data used by a host device (e.g., a computing device of an autonomous vehicle, or another computing device that accesses data stored in the memory device). In one example, the memory device is a solid state drive mounted in an electric vehicle.

In some cases, data may be stored at elevated temperatures. In other cases, data may be stored for extended times without power. In either case, there is an increased risk of data loss (e.g., due to corrupted bits). In one example, data is stored in a device that will undergo high-temperature re-flow (e.g., for usage in automobiles). In another example, data may be stored in a device that will be placed in a storage facility or location for an extended time, such as a vehicle that is parked in storage for an extended time (e.g., in a parking lot), or after a product is manufactured and waiting in storage for physical transport or other further use in manufacturing. These various situations present a technical problem in which the stored data is prone to errors that can corrupt the usefulness of the data.

Various embodiments of the present disclosure provide a technological solution to the above technical problem by using two levels of parity protection for stored data. In one embodiment, higher error correction code (ECC) protection is achieved by creating second level parity data (e.g., second set of parity bits) among several codewords that are already parity protected (e.g., by first level parity data such as a first set of parity bits). One advantage is that the second level of parity protection provides better error correctability than the first level of parity protection. The use of two levels of parity protection provides the advantage of a higher level of protection against data corruption than provided by a normal ECC when the two levels of parity protection are used (e.g., while the device is operating in field).

More powerful error correction generally requires more processing power be used for the correction of errors. In many cases, the first level of parity correction is implemented with hardware and optionally assisted with firmware. In many cases, the second level of parity protection can be implemented with software, and is potentially assisted by another computing system (e.g., a host server), which has significantly more processing power than a storage device (e.g. SSD) that is storing data for the computing system.

In one embodiment, a method includes: receiving data from a host system; encoding the received data using a first error correction code to generate first parity data; determining a temperature at which memory cells will store the received data; identifying, based on the determined temperature, at least a first portion of the received data; encoding the first portion of the received data using a second error correction code to generate second parity data, where the second error correction code has a higher error correction capability than the first error correction code; and storing the first portion, the first parity data, and the second parity data in the memory cells.

For example, the temperature determined above can be a predicted temperature at which data will be stored at a future time. In one example, the future time is a predetermined time (e.g., a time at which a future high-temperature exposure will occur in operation of a system or during manufacture of a product). In one example, the prediction is made using an artificial neural network or other machine-learning model.

In some embodiments, an alternative and/or additional determination can be made that data will be stored for an extended storage time without power. In one example, the determination is made that data will be stored for more than a predetermined time period (e.g., more than 5-60 days, or more than 24 hours). In some embodiments, a determination is made that a storage device will be both exposed to an elevated temperature and stored without power for more than a predetermined time. In response to all such cases, data can be stored using a second level of parity protection as described herein.

In some cases, the data to be stored at the second level of parity protection is specifically identified. For example, the identified data may be critical data that is essential for operation of a computing system or machine, or data which is not easily replaced or obtained from other sources in case of loss. In one example, the identified data can be sent from the storage device to a host system having more processing resources for performing additional processing to implement the second level of parity protection on the storage device prior to occurrence of the elevated temperature or extended storage time.

Data that is not specifically identified, such as less critical data (e.g., music media for an entertainment system), does not need to be stored at the second level of parity protection. However, less critical data can also be stored at the second level of parity protection when desired, such as when adequate energy or processing resources are available and/or sufficient time is available to perform the processing for the second level of parity protection prior to entering an elevated temperature or extended storage time scenario.

In some embodiments, errors occur between storing data into memory cells (e.g., memory cells uses as storage media in non-volatile memory chips of an SSD) and retrieving data from memory cells. To facilitate the retrieval of error-free data, a memory sub-system (e.g., used in the SSD) can encode data received from a host system using an error correction code (ECC), such as a low-density parity-check (LDPC) code, and store the encoded data in the memory cells. Decoding the encoded data retrieved from the memory cells can remove or reduce errors.

In one example, the error rate distribution is non-uniform across multiple memory pages of different programming modes and/or across wordlines in flash memory. For example, a memory sub-system can include pages programmed in an SLC (single level cell) mode, an MLC (multi-level cell) mode, a TLC (triple level cell) mode, a QLC (quad level cell) mode, etc. When configured in the SLC mode, each memory cell in a page stores one bit of data. When configured in the MLC mode, each memory cell in the page stores two bits of data. When configured in the TLC mode, each memory cell in the page stores three bits of data. When configured in the QLC mode, each memory cell in the page stores four bits of data. When the number of bits stored in a cell increases, the likelihood of errors in the data retrieved from the cell increases.

In one example, a block of a storage device can have most of its memory cells in QLC mode and some memory cells in SLC mode and/or TLC mode. When LP, MP, UP and XP pages are used to program memory cells in QLC mode using a multi-pass programming technique, the decoding of the LP page is similar to the decoding of a page in SLC mode, which has the highest signal to noise (S/N) ratio and lowest bit error rate (BER). The decoding of MP and UP pages is similar to the decoding of a page in TLC mode, which has medium S/N ratio and medium BER. The decoding of XP page is similar to the decoding of a page in QLC mode, which has the lowest S/N ratio and the highest BER.

In some embodiments, two-layer encoding can be used for handling a non-uniform error rate distribution across pages having different programming modes. For example, the two-layer encoding can include a first layer of LDPC code configured according to a nominal bit error rate (e.g., 0.005), instead of a worst case bit error rate (e.g., 0.01). A second layer of erasure code is configured to stride across the codewords in a page having different programming modes (e.g., SLC, MLC, TLC, QLC). For example, a symbol size of the erasure code used in the second layer can be 16 bytes. In one example, a first layer can use a 4K LDPC with a code rate of 0.9 such that the ratio between the LDPC payload size over LDPC codeword size is 0.9.

FIG. 1 illustrates a storage device 101 (e.g., an SSD, or a NAND-based flash memory chip or module) that encodes stored data using two levels of parity data, in accordance with some embodiments. Storage device 101 receives data to be stored from host system 127 (e.g., over a serial communications interface, or a wireless communications interface). Storage device 101 stores the received data in memory cells 103. In one example, memory cells 103 may be provided by one or more non-volatile memory chips. In one example, the memory chips are NAND-based flash memory.

Storage device 101 implements error correction using an error correction code 123 and an error correction code 125. Error correction code 125 has a higher error correction capability than error correction code 123. As data is received from host system 127, the received data is encoded using error correction code 123 to provide parity data 115. Some or all of the received data is also encoded using error correction code 125 to provide parity data 117 and/or parity data 119. Processing device 121 can be used to implement the error correction codes in hardware and/or software.

In some cases, only a portion of the received data is encoded using both error correction codes. In one example, encoding using the second error correction code is restricted when processing resources are limited. In one example, the processing resources can be limited due to reduced central processing power, reduced working memory availability, and/or a limited power supply.

In cases where only a portion of the received data is encoded using the second error correction code, the portion of the received data to be encoded using both error correction codes is identified. In one example, the portion of the data is identified based on a temperature at which received data will be stored and a criticality of the data.

In one embodiment, if it is determined that storage device 101 will be exposed to elevated temperatures, then the identified portion of data to be encoded using the second error correction code 125 is determined based on identifying data that is most susceptible to elevated temperatures. In one example, this data is data stored using one or more programming modes in which more than one bit of data is stored in each memory cell. In one example, such data is stored using an MLC, TLC, and/or QLC mode.

In one example, the determined temperature is at least 35 degrees Celsius. In one example, the determined temperature is 50 degrees Celsius or higher.

In one embodiment, data 109 is received from host system 127. Data 109 includes a portion 111 stored in cells 105 in an SLC mode, and a portion 113 stored in cells 107 (e.g., in an MLC, TLC, and/or QLC mode). When received, data 109 is encoded using error correction code 123 to generate parity data 115. The parity data 115 can be stored in memory cells 103 with the corresponding data portions.

In one embodiment, portion 113 of data 109 is identified as being more susceptible to errors when in elevated temperature storage. In response to predicting a future elevated temperature (e.g., a temperature above a predetermined threshold), portion 113 is encoded using second error correction code 125 to generate parity data 119. Parity data 119 can be stored in cells 107 with the corresponding encoded data.

In some embodiments, portion 111 can also be encoded using error correction code 125 to generate parity data 117. Parity data 117 can be stored in cells 105 with the corresponding encoded data. For example, portion 111 can be encoded using error correction code 125 based on the determination that processing resources and/or power resources are above a predetermined threshold, and/or other factors indicating the adequacy or an increased availability of such resources.

In one embodiment, data is read from memory cells 103 after having been stored. When reading the data (e.g., in response to receiving a read command), a determination is made by processing device 121 of a processing capability of host system 127. For example, processing device 121 may determine that host system 127 has processing resources that exceed a predetermined threshold. In response to this determination, processing device 121 sends portion 113 and parity data 119 to host system 127 for decoding using error correction code 125 (which has higher error correction capability, but requires more processing resources than ECC 123).

In one embodiment, host system 127 itself is able to store data using two levels of parity protection. Specifically, host system 127 implements error correction code 141 and error correction code 143. Error correction code 143 has a higher error correction capability than error correction code 141. In one example, error correction code 141 is identical to error correction code 123, and error correction code 143 is identical to error correction code 125.

In one example, system 127 stores data 129, which comprises portions 131 and 133, each of which is encoded using error correction code 141 to provide parity data 135. In response to predicting an elevated temperature in future operation of host system 127, portion 133 is identified as being critical data (e.g., an essential software program for control of vehicle navigation or braking). Portion 133 is encoded using error correction code 143 to provide parity data 139. Optionally, portion 131 can be encoded using error correction code 143 to provide parity data 137.

In one embodiment, in response to determining a temperature at which data will be stored that is associated with increased data storage errors, host system 127 sends identified portion 133 to storage device 101 for storage in memory cells 103.

In one example, portion 133 is sent to storage device 101 with parity data 135, 139. Upon receipt, processing device 121 encodes portion 133 using error correction code 125 to provide parity data 119. The received portion 133 and parity data 119, 135, and/or 139 are stored in memory cells 105 or memory cells 107.

Figure 2:
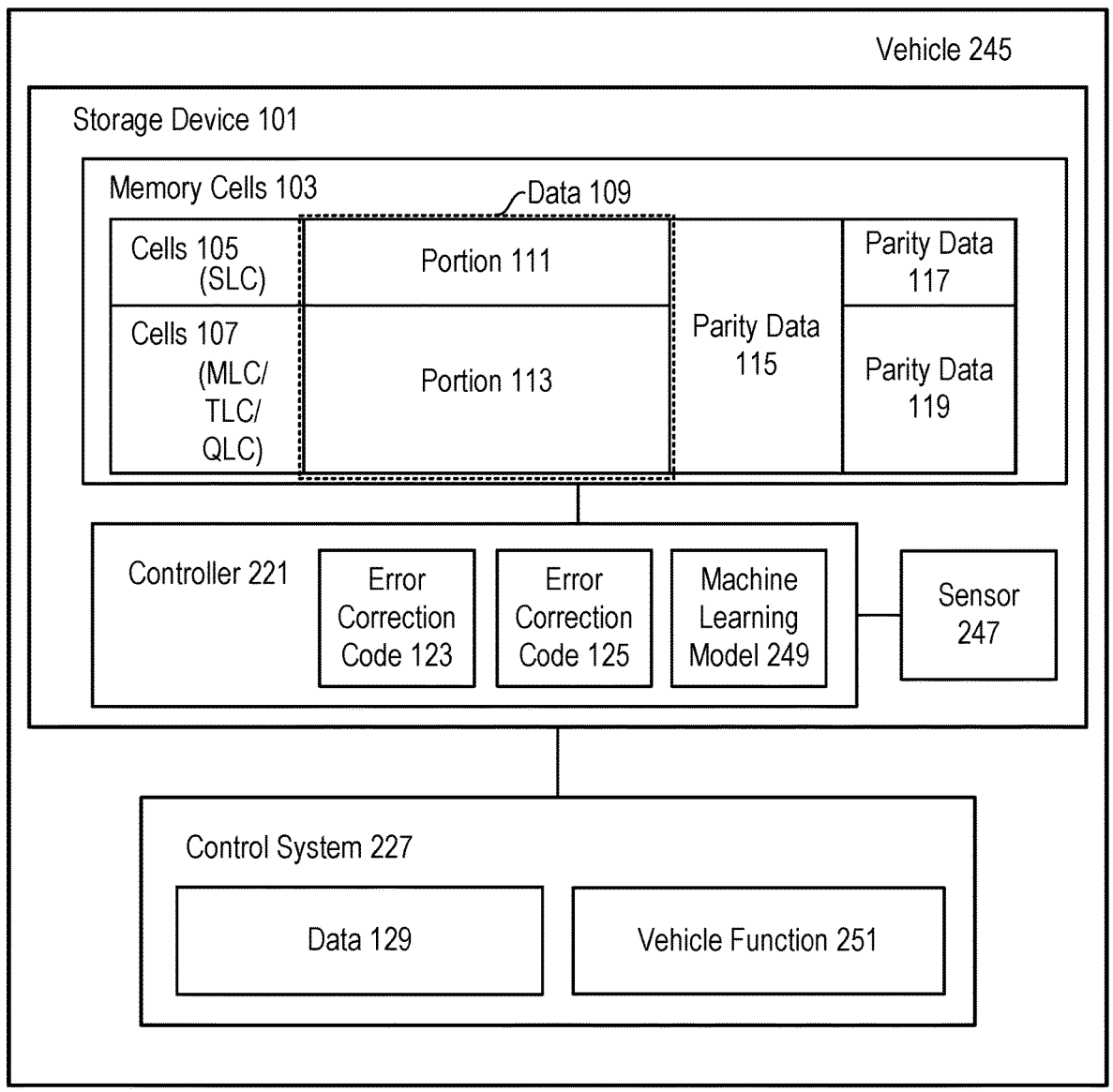
FIG. 2 illustrates a vehicle that stores data for a control system of the vehicle using two layers of error correction coding, in accordance with some embodiments.

FIG. 2 illustrates a vehicle 245 that stores data for a control system 227 of vehicle 245 using two levels or layers of error correction coding, in accordance with some embodiments. A first layer of error correction coding is provided by ECC 123, and a second layer of error correction coding is provided by ECC 125.

Control system 227 controls various vehicle functions 251 of vehicle 245. In one example, vehicle functions 251 include motor control, navigation control, and/or control of other hardware of vehicle 245 that performs operational functions when vehicle 245 is being used by an operator (e.g., a driver or passenger). Control system 227 stores data 129 that is used in controlling vehicle function 251.

Control system 227 is able to send at least portions of data 129 to storage device 101 for storage. For example, a portion of data 129 is sent as data 109, which is received by controller 221 from control system 227 and stored in memory cells 103. Data 109 is encoded using ECC 123 and ECC 125 to provide parity data 115, 117, 119.

In one embodiment, controller 221 determines a temperature of storage device 101 using sensor 247. Signaling provided by sensor 247 is used by controller 221 as input to machine learning model 249 (e.g., an artificial neural network). An output from machine learning model 249 is used to predict a temperature at which storage device 101 will operate in the future. Based on this prediction, controller 221 identifies data stored in memory cells 103 for which additional encoding is performed using error correction code 125.

In some cases, the identified data can be sent to control system 227 for processing using error correction code 125 (e.g., for either or both encoding and decoding by control system 227). The identified data processed at control system 227 can be stored locally and/or sent to storage device 101 for storage with its corresponding parity data (e.g., portion 113 and parity data 119).

Figure 3:
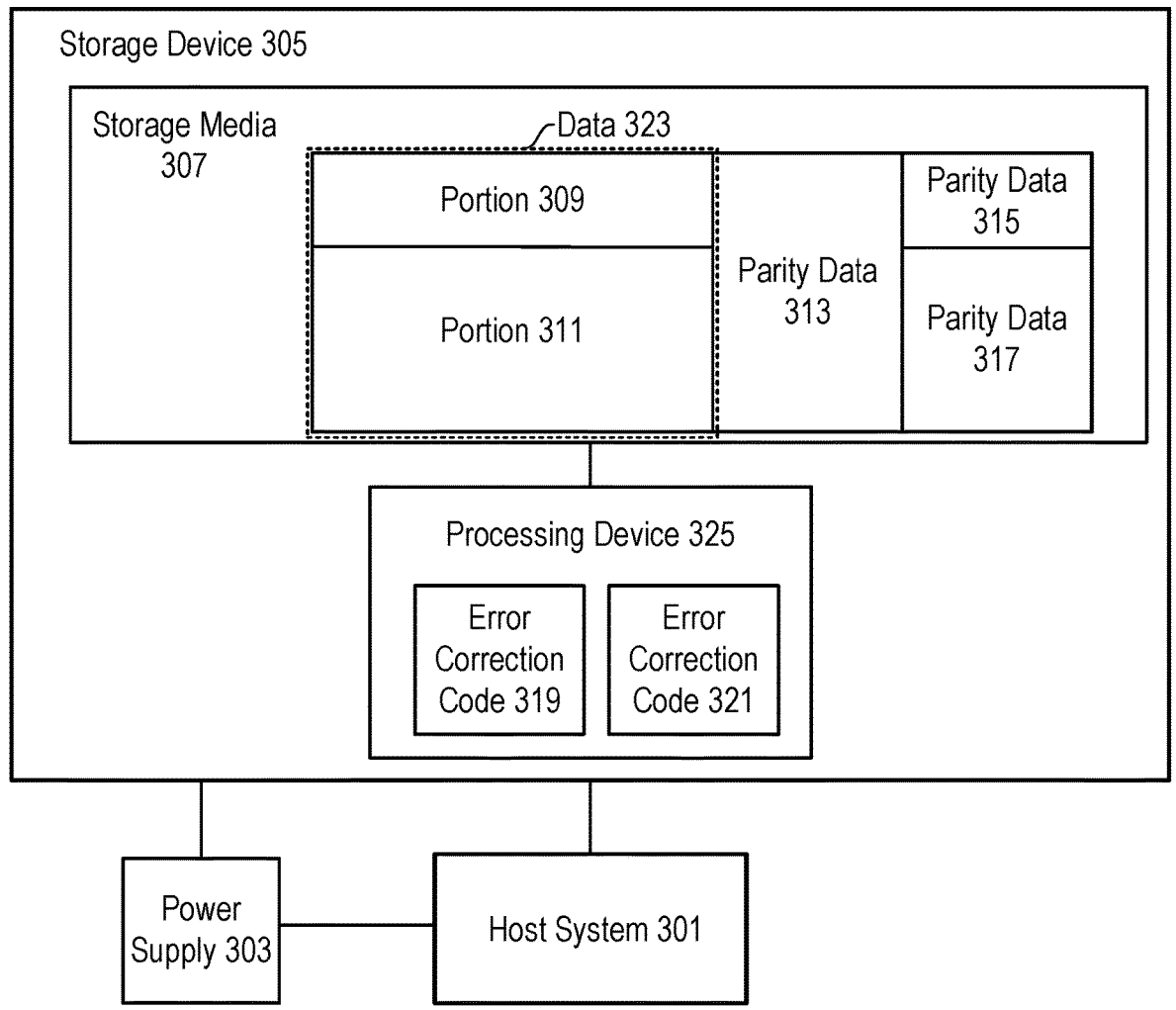
FIG. 3 illustrates a storage device that encodes stored data based on monitoring a power supply, in accordance with some embodiments.

FIG. 3 illustrates a storage device 305 that encodes stored data based on monitoring a power supply 303, in accordance with some embodiments. Storage device 305 is an example of storage device 101. Storage device 305 includes storage media 307 (e.g., memory cells in an integrated circuit die) that stores data 323 received by processing device 325 from host system 301. Host system 301 is an example of host system 127 or control system 227.

Data 323 is received from host system 301 and encoded using error correction 319 to provide parity data 313. In one example, all data received from host system 301 is encoded using error correction code 319.

In one embodiment, processing device 325 monitors power availability from power supply 303. Processing device 325 determines based on signaling from power supply 303 and/or host system 301 that available power from power supply 303 will be falling below a predetermined threshold. In one example, the determination is made that a supply voltage from power supply 303 will fall below a predetermined voltage. In one example, this determination is made by host system 301, which monitors power supply 303 and sends signaling to processing device 325. Power supply 303 supplies power to storage device 305 and/or host system 301.

In response to a determination made based on monitoring power supply 303, such as described above, portion 311 of data 323 is identified as being critical data. Portion 311 is encoded using error correction code 321, which has a higher error correction capability than error correction code 319, to provide parity data 317. Portion 311 and parity data 317 are stored in storage media 307.

Optionally, portion 309 can also be encoded using error correction code 321 to provide parity data 315. Portion 309 and parity data 315 are stored in storage media 307 (e.g., in QLC memory cells).

Figure 4:
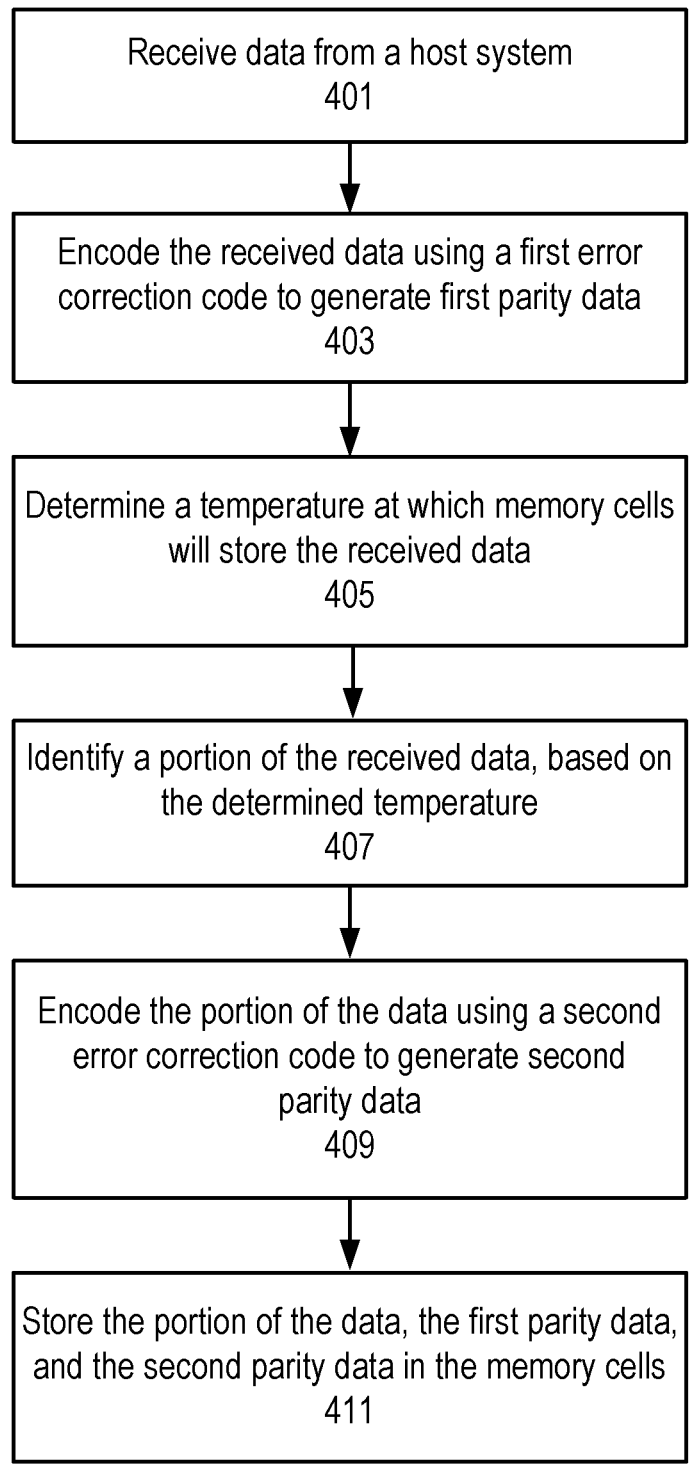
FIG. 4 shows a method for encoding data received from a host system using two different error correction codes, in accordance with some embodiments.

FIG. 4 shows a method for encoding data received from a host system using two different error correction codes to implement two-level parity protection, in accordance with some embodiments. For example, the method of FIG. 4 can be implemented in the system of FIG. 1. In one example, the error correction codes are ECC 123 and ECC 125. In one example, the host system is host system 127 or control system 227.

The method of FIG. 4 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 4 is performed at least in part by one or more processing devices (e.g., processing device 121 or controller 221).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 401, data is received from a host system. In one example, the received data is data 109 or data 323.

At block 403, the received data is encoded using a first error correction code to generate first parity data. In one example, data 109 is encoded using ECC 123 or ECC 319.

At block 405, a temperature is determined at which memory cells will store the received data. In one example, the temperature is determined using sensor 247 based on a predicted temperature provided as an output from machine learning model 249. In one example, the memory cells are memory cells 103, or memory cells of storage media 307.

At block 407, a portion of the received data is identified based on the determined temperature. In one example, portion 113 or portion 311 is identified.

At block 409, the identified portion of the data is encoded using a second error correction code to generate second parity data. In one example, portion 113 or portion 311 is encoded using ECC 125 or ECC 321.

At block 411, the identified portion of the data is stored with the first parity data and the second parity data in the memory cells. In one example, the first parity data is parity data 115, and the second parity data is parity data 119.

Figure 5:
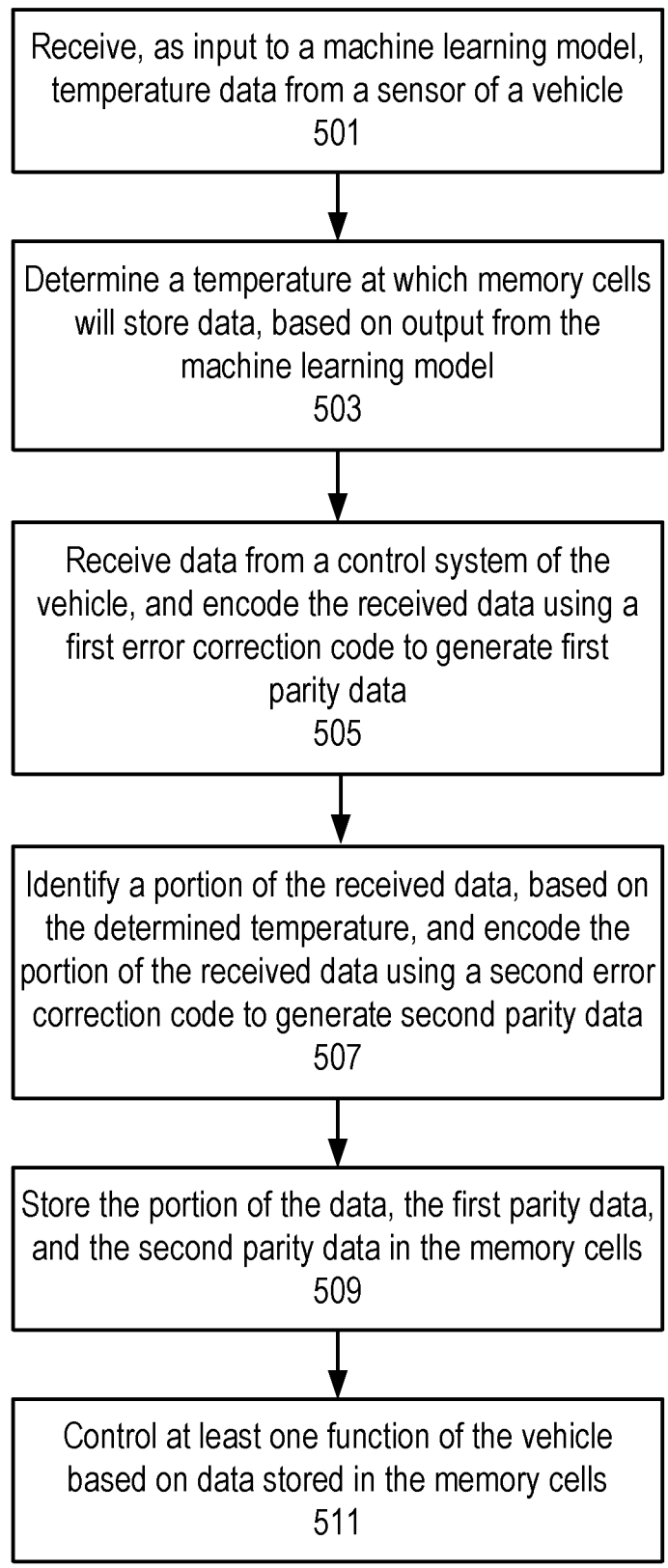
FIG. 5 shows a method for identifying data to be stored using two-layer encoding/decoding based on determining a temperature at which data is stored in a storage device, in accordance with some embodiments.

FIG. 5 shows a method for identifying data to be stored using two-layer encoding/decoding based on determining a temperature at which data is stored in a storage device, in accordance with some embodiments. For example, the method of FIG. 5 can be implemented in the system of FIG. 2. In one example, the temperature is an ambient temperature of storage device 101, or a temperature of memory cells 103 inside storage device 101 (e.g., a surface temperature of a memory die or printed circuit board).

The method of FIG. 5 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 5 is performed at least in part by one or more processing devices (e.g., controller 221).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 501, temperature data is received from a sensor of a vehicle and used as input to a machine learning model. In one example, the sensor is sensor 247 and the machine learning model is machine learning model 249.

At block 503, a temperature is determined at which memory cells will store data based on an output from the machine learning model. In one example, the memory cells are memory cells 103, or memory cells of storage media 307.

At block 505, data is received from a control system of the vehicle. The received data is encoded using a first error correction code to generate first parity data. In one example, the control system is control system 227 or host system 301.

At block 507, a portion of the received data is identified based on the determined temperature. The identified portion is encoded using a second error correction code to generate second parity data. In one example, portion 311 is identified and encoded using error correction code 321 to provide parity data 317.

At block 509, the identified portion of the data is stored in the memory cells along with the first parity data and the second parity data. In one example, the first parity data is parity data 115, and the second parity data is parity data 119 (and/or parity data 117).

At block 511, at least one function of the vehicle is controlled based on data stored in the memory cells. In one example, the function is vehicle function 251, which has its operation configured by control system 227 using data of portion 113 or portion 111.

In one embodiment, a method for a memory device includes: receiving data from a host system (e.g., host system 127, control system 227, or host system 301); encoding the received data using a first error correction code (e.g., ECC 123) to generate first parity data; determining a temperature at which memory cells will store the received data; identifying, based on the determined temperature, at least a first portion of the received data; encoding the first portion of the received data using a second error correction code (e.g., ECC 125) to generate second parity data, where the second error correction code has a higher error correction capability than the first error correction code; and storing the first portion, the first parity data, and the second parity data in the memory cells.

In one embodiment, encoding the received data using the first error correction code includes: splitting the received data into data units according to a predetermined size of payload; and encoding each respective data unit of the size of payload using the first error correction code to generate the first parity data.

In one embodiment, the memory cells include first cells programmed in a single-level cell (SLC) mode (e.g., cells 105), and second cells programmed in at least one of a multi-level cell (MLC) mode, a triple-level cell (TLC) mode, or a quad-level cell (QLC) mode (e.g., cells 107).

In one embodiment, the first portion of the received data is stored in the second cells.

In one embodiment, encoding the first portion of the received data using the second error correction code is performed by the host system.

In one embodiment, the host system is a control system of a vehicle (e.g., vehicle 245), and the control system is configured to control at least one function of the vehicle based on data stored in the memory cells.

In one embodiment, the method further includes selecting the error correction capability of the second error correction code based on the determined temperature.

In one embodiment, the determined temperature is a current temperature associated with a storage device, and the method further includes selecting a type of the second error correction code based on the current temperature.

In one embodiment, identifying the first portion of the received data is further based on a programming mode used by the memory cells.

In one embodiment, a system includes: a storage device (e.g., storage device 101, storage device 305) configured to store data from a host system; and at least one processing device configured to: receive first data from the host system; encode the first data using a first error correction code to generate first parity data; determine at least one of a temperature at which the storage device will store the first data, or a time of storage for which the storage device will store the first data; identify, based on the at least one of the temperature or the time of storage, at least a first portion of the first data; encode the first portion of the first data using a second error correction code to generate second parity data, where the second error correction code has a higher error correction capability than the first error correction code; and store the first portion, the first parity data, and the second parity data in the storage device.

In one embodiment, the at least one processing device is further configured to: retrieve the first portion of the first data from the storage device; decode the first portion using the first error correction code; determine that the decoding is not successful; and in response to determining that the decoding is not successful, decode the first portion using the second error correction code.

In one embodiment, the at least one processing device is further configured to: determine that a processing capability of the host system is above a predetermined threshold; and in response to determining that the processing capability is above the predetermined threshold, send the first portion to the host system. The first portion is decoded by the host system using the second error correction code.

In one embodiment, the storage device includes a controller configured to encode the first data using the first error correction code.

In one embodiment, the system further includes at least one sensor (e.g., sensor 247). The temperature is determined based on an output from a machine learning model (e.g., machine learning model 249), and data collected by the sensor is an input to the machine learning model. The determined temperature is a predicted temperature, and the first portion of the first data is identified based on the determined temperature.

In one embodiment, the at least one sensor determines at least one of an ambient temperature of the storage device, or an internal temperature of the storage device.

In one embodiment, the at least one processing device is further configured to send the second parity data (e.g., parity data 119) to the host system for storage in memory (e.g., a non-volatile memory device) of the host system; and the first portion of the first data is decoded by the host system using the second error correction code and the second parity data.

In one embodiment, a non-transitory computer storage medium stores instructions which, when executed in a memory sub-system, cause the memory sub-system to perform a method, the method including: receiving first data from a host system; encoding the first data using a first error correction code to generate first parity data; determining that a storage device configured to store data received from the host system will stop receiving power from a power supply (e.g., power supply 303); in response to determining that the storage device will stop receiving power from the power supply, identifying at least a first portion of the first data; encoding the first portion using a second error correction code to generate second parity data, where the second error correction code has a higher error correction capability than the first error correction code; and storing the first portion, the first parity data, and the second parity data in the storage device.

In one embodiment, the method further includes: determining that the power from the power supply is available for the storage device; in response to determining that the power from the power supply is available, determining that a loss of data in the first portion has occurred; in response to determining that the loss of data in the first portion has occurred, sending the first portion to the host system. The first portion is decoded by the host system using the second error correction code.

In one embodiment, determining that the loss of data in the first portion has occurred includes: retrieving the first portion from the storage device; decoding the first portion using the first error correction code; and determining that the decoding is not successful.

In one embodiment, the method further includes: encoding a second portion of the first data, where a data size of the second portion is greater than the first portion; storing the second portion in the storage device; determining a first result from decoding the first portion using the first error correction code; determining a second result from decoding the first portion using the second error correction code; comparing the first result and the second result; determining, based on comparing the first result and the second result, a failure to decode the first portion; and in response to determining the failure to decode the first portion, sending the second portion to the host system for decoding using the second error correction code.

In one embodiment, software error correction codes are located in a cloud network. In one example, storage device 101 sends parity data 119 to the cloud network for decoding using one of the software error correction codes (e.g., ECC 125). In one example, the error correction code to be used for encoding and/or decoding is selected based on a temperature predicted by storage device 101, or a temperature determined by storage device 101. In one example, storage device 101 communicates with the cloud network by wireless communications (e.g., 5G wireless communications by an SSD in a vehicle with an edge server positioned within 100 to 1,000 meters of the vehicle, or within 50 to 3,000 meters of a roadway on which the vehicle is traveling).

In some embodiments, two-layer encoding is used to encode data for storage in a memory sub-system. For example, a memory sub-system can be a storage device (e.g., storage device 101), a memory module, or a hybrid of a storage device and memory module. Examples of storage devices and memory modules are described below in conjunction with FIG. 6. In general, a host system can utilize a memory sub-system that includes one or more components, such as memory devices that store data. The host system can provide data to be stored at the memory sub-system, and can request data to be retrieved from the memory sub-system.

Figure 6:
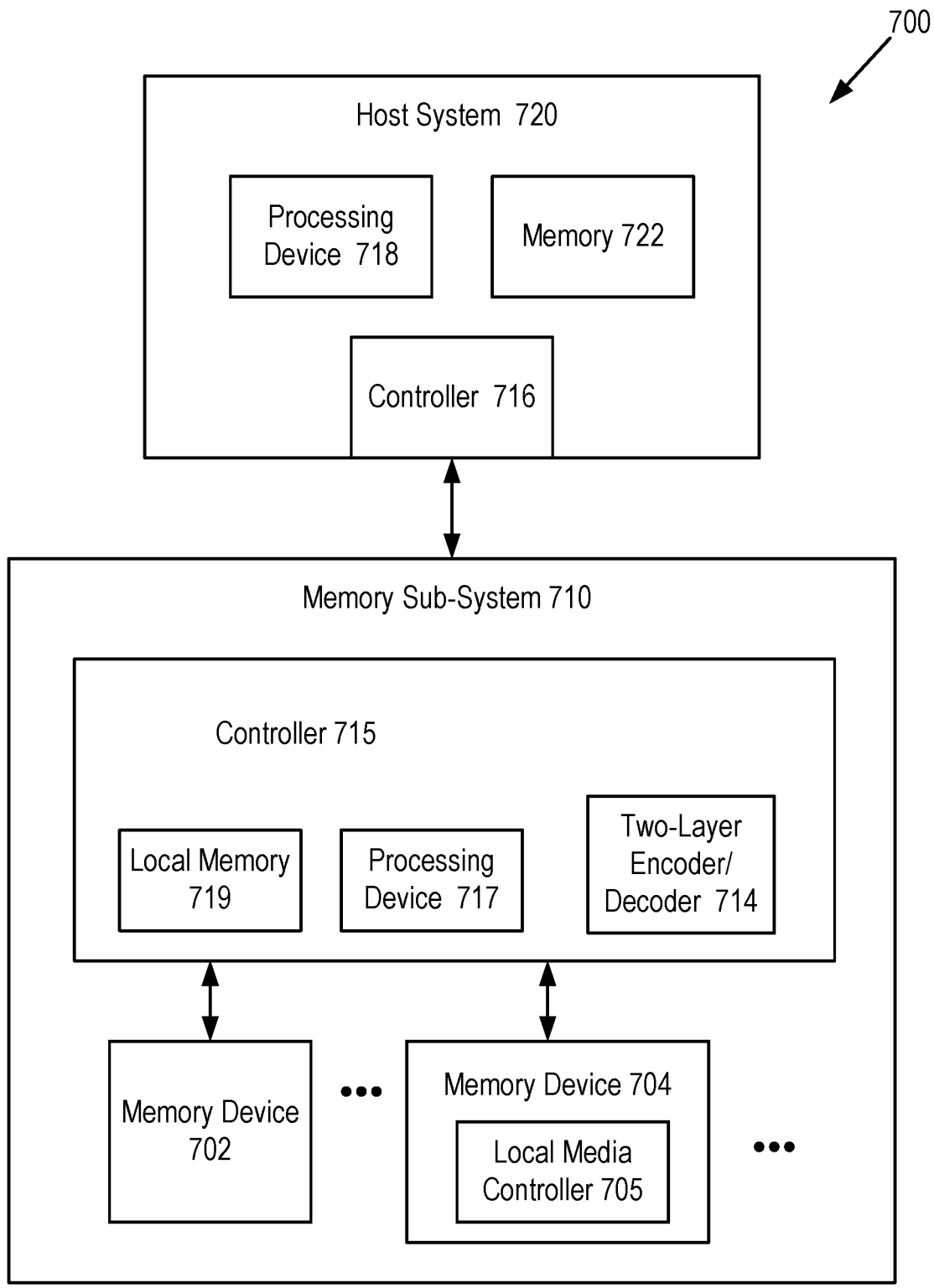
FIG. 6 illustrates an example computing system that includes a memory sub-system in accordance with some embodiments of the present disclosure.

FIG. 6 illustrates an example computing system 700 that includes memory sub-system 710 in accordance with some embodiments of the present disclosure. The memory sub-system 710 can include media, such as one or more volatile memory devices (e.g., memory device 702), one or more non-volatile memory devices (e.g., memory device 704), or a combination of such. Storage device 101 is an example of memory sub-system 710, and host system 127 is an example of host system 720.

A memory sub-system 710 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 700 can be, for example, a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 700 can include a host system 720 that is coupled to one or more memory sub-systems 710. FIG. 6 illustrates one example of a host system 720 coupled to one memory sub-system 710.

The host system 720 can include a processor chipset (e.g., processing device 718) and a software stack executed by the processor chipset. The processor chipset can include one or more cores, one or more caches, a memory controller (e.g., controller 716) (e.g., NVDIMM controller), and a storage protocol controller (e.g., PCIe controller, SATA controller). The host system 720 uses the memory sub-system 710, for example, to write data to the memory sub-system 710 and read data from the memory sub-system 710.

The host system 720 can be coupled to the memory sub-system 710 via a physical host interface. Examples of a physical host interface include, but are not limited to, a Serial Advanced Technology Attachment (SATA) interface, a Peripheral Component Interconnect Express (PCIe) interface, Universal Serial Bus (USB) interface, Fibre Channel, Serial Attached SCSI (SAS), a Double Data Rate (DDR) memory bus, Small Computer System Interface (SCSI), a Dual In-line Memory Module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 720 and the memory sub-system 710. The host system 720 can further utilize an NVM Express (NVMe) interface to access components (e.g., memory devices 704) when the memory sub-system 710 is coupled with the host system 720 by the PCIe interface. The physical host interface can provide an interface for passing control, address, data, and other signals between the memory sub-system 710 and the host system 720. FIG. 1 illustrates a memory sub-system 710 as an example. In general, the host system 720 can access multiple memory sub-systems via a same communication connection, multiple separate communication connections, and/or a combination of communication connections.

The processing device 718 of the host system 720 can be, for example, a microprocessor, a central processing unit (CPU), a processing core of a processor, an execution unit, etc. In some instances, the controller 716 can be referred to as a memory controller, a memory management unit, and/or an initiator. In one example, the controller 716 controls the communications over a bus coupled between the host system 720 and the memory sub-system 710. In general, the controller 716 can send commands or requests to the memory sub-system 710 for desired access to memory devices 702, 704. The controller 716 can further include interface circuitry to communicate with the memory sub-system 710. The interface circuitry can convert responses received from memory sub-system 710 into information for the host system 720.

The controller 716 of the host system 720 can communicate with controller 715 of the memory sub-system 710 to perform operations such as reading data, writing data, or erasing data at the memory devices 702, 704 and other such operations. In some instances, the controller 716 is integrated within the same package of the processing device 718. In other instances, the controller 716 is separate from the package of the processing device 718. The controller 716 and/or the processing device 718 can include hardware such as one or more integrated circuits (ICs) and/or discrete components, a buffer memory, a cache memory, or a combination thereof. The controller 716 and/or the processing device 718 can be a microcontroller, special purpose logic circuitry (e.g., a Field Programmable Gate Array (FPGA), an Application Specific Integrated Circuit (ASIC), etc.), or another suitable processor.

The memory devices 702, 704 can include any combination of the different types of non-volatile memory components and/or volatile memory components. The volatile memory devices (e.g., memory device 702) can be, but are not limited to, Random Access Memory (RAM), such as Dynamic Random Access Memory (DRAM) and Synchronous Dynamic Random Access Memory (SDRAM).

Some examples of non-volatile memory components include a Negative-AND (NAND) type flash memory and write-in-place memory, such as three-dimensional cross point memory. A cross point array of non-volatile memory can perform bit storage based on a change of bulk resistance, in conjunction with a stackable cross-gridded data access array. Additionally, in contrast to many flash-based memories, cross point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 704 can include one or more arrays of memory cells (e.g., memory cells 103). One type of memory cell, for example, Single Level Cells (SLCs) can store one bit per cell. Other types of memory cells, such as Multi-Level Cells (MLCs), Triple Level Cells (TLCs), Quad-Level Cells (QLCs), and penta-level cells (PLCs) can store multiple bits per cell. In some embodiments, each of the memory devices 704 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 704 can be grouped as pages that can refer to a logical unit of the memory device used to store data. With some types of memory (e.g., NAND), pages can be grouped to form blocks.

Although non-volatile memory devices such as 3D cross point type and NAND type memory (e.g., 2D NAND, 3D NAND) are described, the memory device 704 can be based on any other type of non-volatile memory, such as Read-Only Memory (ROM), Phase Change Memory (PCM), self-selecting memory, other chalcogenide based memories, Ferroelectric Transistor Random-Access Memory (Fe-TRAM), Ferroelectric Random Access Memory (FeRAM), Magneto Random Access Memory (MRAM), Spin Transfer Torque (STT)-MRAM, Conductive Bridging RAM (CBRAM), Resistive Random Access Memory (RRAM), Oxide based RRAM (OxRAM), Negative-OR (NOR) flash memory, and Electrically Erasable Programmable Read-Only Memory (EEPROM).

A memory sub-system controller 715 (or controller 715 for simplicity) can communicate with the memory devices 704 to perform operations such as reading data, writing data, or erasing data at the memory devices 704 and other such operations (e.g., in response to commands scheduled on a command bus by controller 716). The controller 715 can include hardware such as one or more Integrated Circuits (ICs) and/or discrete components, a buffer memory, or a combination thereof. The hardware can include digital circuitry with dedicated (i.e., hard-coded) logic to perform the operations described herein. The controller 715 can be a microcontroller, special purpose logic circuitry (e.g., a Field Programmable Gate Array (FPGA), an Application Specific Integrated Circuit (ASIC), etc.), or another suitable processor.

The controller 715 can include a processing device 717 (processor) configured to execute instructions stored in a local memory 719. In the illustrated example, the local memory 719 of the controller 715 includes an embedded memory configured to store instructions for performing various processes, operations, logic flows, and routines that control operation of the memory sub-system 710, including handling communications between the memory sub-system 710 and the host system 720.

In some embodiments, the local memory 719 can include memory registers storing memory pointers, fetched data, etc. The local memory 719 can also include Read-Only Memory (ROM) for storing micro-code. While the example memory sub-system 710 in FIG. 6 has been illustrated as including the controller 715, in another embodiment of the present disclosure, a memory sub-system 710 does not include a controller 715, and can instead rely upon external control (e.g., provided by an external host, or by a processor or controller separate from the memory sub-system).

In general, the controller 715 can receive commands or operations from the host system 720 and can convert the commands or operations into instructions or appropriate commands to achieve the desired access to the memory devices 704. The controller 715 can be responsible for other operations such as wear leveling operations, garbage collection operations, error detection and error correction code (ECC) operations, encryption operations, caching operations, and address translations between a logical address (e.g., Logical Block Address (LBA), namespace) and a physical address (e.g., physical block address) that are associated with the memory devices 704.

The controller 715 can further include host interface circuitry to communicate with the host system 720 via the physical host interface. The host interface circuitry can convert the commands received from the host system into command instructions to access the memory devices 704 as well as convert responses associated with the memory devices 704 into information for the host system 720.

The memory sub-system 710 can also include additional circuitry or components that are not illustrated. In some embodiments, the memory sub-system 710 can include a cache or buffer (e.g., DRAM) and address circuitry (e.g., a row decoder and a column decoder) that can receive an address from the controller 715 and decode the address to access the memory devices 704.

In some embodiments, the memory devices 704 include local media controllers 705 that operate in conjunction with memory sub-system controller 715 to execute operations on one or more memory cells of the memory devices 704. An external controller (e.g., memory sub-system controller 715) can externally manage the memory device 704 (e.g., perform media management operations on the memory device 704). In some embodiments, a memory device 704 is a managed memory device, which is a raw memory device combined with a local controller (e.g., local controller 705) for media management within the same memory device package. An example of a managed memory device is a Managed NAND (MNAND) device.

In one embodiment, the computing system 700 includes a two-layer encoder/decoder 714 in the memory sub-system 710 that uses at least two error correction codes (e.g., ECC 123, 125) to convert data and/or generate corresponding parity data for storing in media cells of memory devices 702 to 704. In some embodiments, the controller 715 in the memory sub-system 710 includes at least a portion of the two-layer encoder/decoder 714. In other embodiments, or in combination, the controller 716 and/or the processing device 718 in the host system 720 includes at least a portion of the two-layer encoder/decoder 714. For example, the controller 715, the controller 716, and/or the processing device 718 can include logic circuitry implementing the two-layer encoder/decoder 714. For example, the controller 715, or the processing device 718 (processor) of the host system 720, can be configured to execute instructions stored in memory for performing the operations of the two-layer encoder/decoder 714.

In some embodiments, the two-layer encoder/decoder 714 is implemented in an integrated circuit chip disposed in the memory sub-system 710. In other embodiments, the two-layer encoder/decoder 714 is part of an operating system of the host system 720, a device driver, or an application.

In some implementations, a communication channel between the processing device 718 and a memory sub-system 710 includes a computer network, such as a local area network, a wireless local area network, a wireless personal area network, a cellular communications network, a broadband high-speed always-connected wireless communication connection (e.g., a current or future generation of mobile network link); and the processing device 718 and the memory sub-system can be configured to communicate with each other using data storage management and usage commands similar to those in NVMe protocol.

A memory sub-system 710 in general can have non-volatile storage media. Examples of non-volatile storage media include memory cells formed in an integrated circuit and magnetic material coated on rigid disks. Non-volatile storage media can maintain the data/information stored therein without consuming power. Memory cells can be implemented using various memory/storage technologies, such as NAND logic gate, NOR logic gate, Phase-Change Memory (PCM), Magnetic Random Access Memory (MRAM), resistive random-access memory, cross point storage and memory devices. A cross point memory device uses transistor-less memory elements, each of which has a memory cell and a selector that are stacked together as a column. Memory element columns are connected via two perpendicular lays of wires, where one lay is above the memory element columns and the other lay below the memory element columns. Each memory element can be individually selected at a cross point of one wire on each of the two layers. Cross point memory devices are fast and non-volatile and can be used as a unified memory pool for processing and storage.

The controller (e.g., 715) of a memory sub-system (e.g., 710) can run firmware to perform operations responsive to the communications from the processing device 718. Firmware in general is a type of computer program that provides control, monitoring and data manipulation of engineered computing devices.

Some embodiments involving the operation of the controller 715 can be implemented using computer instructions executed by the controller 715, such as the firmware of the controller 715. In some instances, hardware circuits can be used to implement at least some of the functions. The firmware can be initially stored in the non-volatile storage media, or another non-volatile device, and loaded into the volatile DRAM and/or the in-processor cache memory for execution by the controller 715.

A non-transitory computer-readable medium can be used to store instructions of the firmware of a memory sub-system (e.g., 710). When the instructions are executed by the controller 715 and/or the processing device 717, the instructions cause the controller 715 and/or the processing device 717 to perform a method discussed herein.

In one embodiment, a method (e.g., implemented in memory sub-system 710) decodes data that has previously been encoded using two-layer encoding (e.g., encoding using ECC 123, 125 for two-level parity protection as described for FIG. 1). The method can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method is performed at least in part by the two-layer encoder/decoder 714 of FIG. 6. For example, the method can be performed to recover encoded data after the encoded data is stored into memory cells 103 using a multi-pass programming technique in one or more media units (e.g., integrated circuit dies) and then retrieved from the memory cells 103 with possible errors in reading the memory cells 103.

In one embodiment, two-layer encoder/decoder 714 decodes data retrieved from memory cells based on a first error correction code (e.g., a low-density parity-check code). The two-layer encoder/decoder 714 determines whether the decoding according to the first error correction code (e.g., ECC 123) is successful. When all codewords generated using the first error correction code (e.g., ECC 123) can be successfully decoded and/or recovered via the parity data (e.g., parity data 115), the original data based on which the encoded data is generated, stored in and then retrieved from the memory cells is recovered successfully.

If some of the codewords cannot be successfully decoded according to the first error correction code (e.g., ECC 123), the two-layer encoder/decoder 714 identifies symbols that cannot be successfully decoded via the first error correction code. In one example, unsatisfied parity checks in an LDPC code can be used to identify bits in an LDPC codeword that cannot be reliably decoded. The identified symbols can be considered as missing/being erased. The second error correction code (e.g., ECC 125) can then be used to decode those few ambiguous symbols (e.g., using parity data 119). Decoding according to the second error correction code can be performed to recover the missing/erased symbols.

The two-layer encoder/decoder 714 recovers the identified symbols based on the second error correction code. In one example, the recovered symbols can be used to replace the corresponding symbols retrieved from the memory cells and further decoded for data recovery via the first error correction code (e.g., a low-density parity-check code).

In one example, the two-layer encoder/decoder 714 determines whether another iteration is to be performed. For example, if less than a threshold number (e.g., 4) of iterations have been performed, the two-layer encoder/decoder 714 can repeat the above decoding operations for another iteration to recover data. After the threshold number (e.g., 4) of iterations have been performed and the decoding is still not successful, the two-layer encoder/decoder 714 can report a failure in data recovery/decoding.

Figure 7:
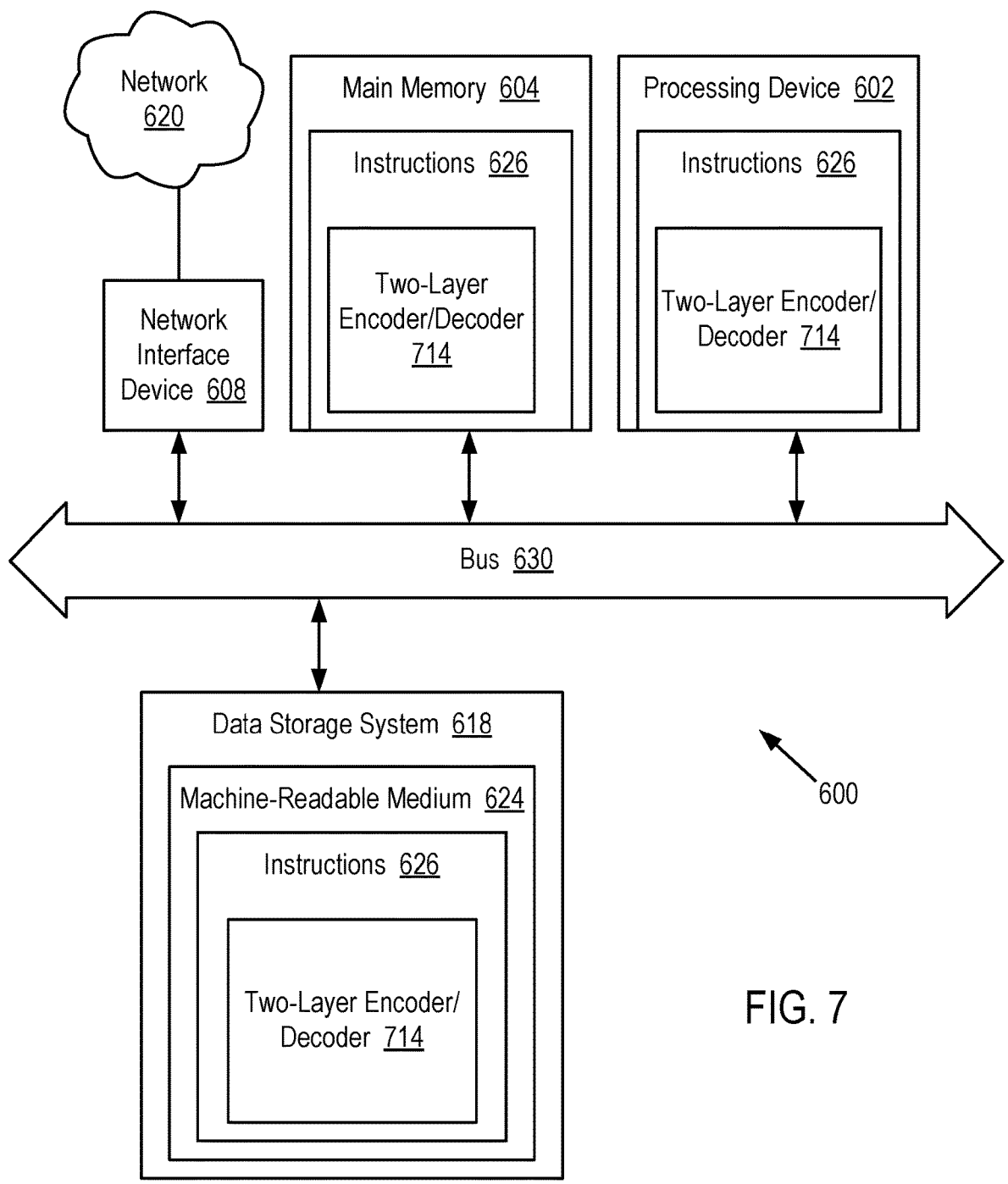
FIG. 7 is a block diagram of an example computer system in which embodiments of the present disclosure can operate.

FIG. 7 illustrates an example machine of a computer system 600 within which a set of instructions, for causing the machine to perform any one or more of the methodologies discussed herein, can be executed. In some embodiments, the computer system 600 can correspond to a host system (e.g., the host system 720 of FIG. 6) that includes, is coupled to, or utilizes a memory sub-system (e.g., the memory sub-system 710 of FIG. 6), or can be used to perform the operations of two-layer encoder/decoder 714 (e.g., to execute instructions to perform operations corresponding to the two-layer encoder/decoder 714 described with reference to FIG. 6). In one example, computer system 600 corresponds to storage device 101 or 305, and/or host system 127 or 301.

In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 618, which communicate with each other via a bus 630 (which can include multiple buses).

In various embodiments, processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also referred to as a computer-readable medium herein) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 710 of FIG. 6. In one embodiment, the instructions 626 include instructions to implement functionality corresponding to two-level parity protection supported by a two-layer encoder/decoder (e.g., the two-layer encoder/decoder 714 described with reference to FIG. 6).

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a processing device or computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

The term "computer-readable medium" or the like as used herein includes a single medium or multiple media that store one or more sets of instructions. Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player.

Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A method comprising:
   receiving data from a host system;
   encoding the received data using a first error correction code to generate first parity data;
   determining a temperature at which memory cells will store the received data;
   identifying at least a first portion of the received data that is to be stored in a part of the memory cells susceptible to the determined temperature;
   encoding the first portion of the received data using a second error correction code to generate second parity data, wherein the second error correction code has a higher error correction capability than the first error correction code; and
   storing the first portion, the first parity data, and the second parity data in the memory cells.

2. The method of claim 1, wherein encoding the received data using the first error correction code comprises:
   splitting the received data into data units according to a predetermined size of payload; and
   encoding each respective data unit of the size of payload using the first error correction code to generate the first parity data.

3. The method of claim 1, wherein the memory cells comprise first cells programmed in a single-level cell (SLC) mode, and second cells programmed in at least one of a multi-level cell (MLC) mode, a triple-level cell (TLC) mode, or a quad-level cell (QLC) mode.

4. The method of claim 3, wherein the first portion of the received data is stored in the second cells.

5. The method of claim 1, wherein encoding the first portion of the received data using the second error correction code is performed by the host system.

6. The method of claim 1, wherein the host system is a control system of a vehicle, and the control system is configured to control at least one function of the vehicle based on data stored in the memory cells.

7. The method of claim 1, further comprising selecting the error correction capability of the second error correction code based on the determined temperature.

8. The method of claim 1, wherein the determined temperature is a current temperature associated with a storage device, the method further comprising selecting a type of the second error correction code based on the current temperature.

9. The method of claim 1, wherein identifying the first portion of the received data is further based on a programming mode used by the memory cells.

10. A system comprising:
a storage device configured to store data from a host system; and
at least one processing device configured to:
receive first data from the host system;
encode the first data using a first error correction code to generate first parity data;
determine at least one of a temperature at which the storage device will store the first data, or a time duration during which the storage device will store the first data;
identify at least a first portion of the first data that is to be stored in a part of the storage device susceptible to the determined temperature or the determined time duration;
encode the first portion of the first data using a second error correction code to generate second parity data, wherein the second error correction code has a higher error correction capability than the first error correction code; and
store the first portion, the first parity data, and the second parity data in the storage device.

11. The system of claim 10, wherein the at least one processing device is further configured to:
retrieve the first portion of the first data from the storage device;
decode the first portion using the first error correction code;
determine that the decoding is not successful; and
in response to determining that the decoding is not successful, decode the first portion using the second error correction code.

12. The system of claim 11, wherein the at least one processing device is further configured to:
determine that a processing capability of the host system is above a predetermined threshold; and
in response to determining that the processing capability is above the predetermined threshold, send the first portion to the host system, wherein the first portion is decoded by the host system using the second error correction code.

13. The system of claim 10, wherein the storage device comprises a controller configured to encode the first data using the first error correction code.

14. The system of claim 10, further comprising at least one sensor, wherein:
the temperature is determined based on an output from a machine learning model, and data collected by the sensor is an input to the machine learning model;
the determined temperature is a predicted temperature; and
the first portion of the first data is identified based on the determined temperature.

15. The system of claim 14, wherein the at least one sensor determines at least one of an ambient temperature of the storage device, or an internal temperature of the storage device.

16. The system of claim 10, wherein:
the at least one processing device is further configured to send the second parity data to the host system for storage in memory of the host system; and
the first portion of the first data is decoded by the host system using the second error correction code and the second parity data.

17. A non-transitory computer-readable medium storing instructions which, when executed in a memory sub-system, cause the memory sub-system to perform a method, the method comprising:
receiving first data from a host system;
encoding the first data using a first error correction code to generate first parity data;
determining that a storage device configured to store data received from the host system is receiving a power supply below a predetermined threshold;
identifying at least a first portion of the first data that is to be stored in a part of the storage device susceptible to the power supply falling below the predetermined threshold;
encoding the first portion using a second error correction code to generate second parity data, wherein the second error correction code has a higher error correction capability than the first error correction code; and
storing the first portion, the first parity data, and the second parity data in the storage device.

18. The non-transitory computer-readable medium of claim 17, wherein the method further comprises:
determining that the power from the power supply is available for the storage device;
in response to determining that the power from the power supply is available, determining that a loss of data in the first portion has occurred;
in response to determining that the loss of data in the first portion has occurred, sending the first portion to the host system, wherein the first portion is decoded by the host system using the second error correction code.

19. The non-transitory computer-readable medium of claim 18, wherein determining that the loss of data in the first portion has occurred comprises:
retrieving the first portion from the storage device;
decoding the first portion using the first error correction code; and
determining that the decoding is not successful.

20. The non-transitory computer-readable medium of claim 17, wherein the method further comprises:
encoding a second portion of the first data, wherein a data size of the second portion is greater than the first portion;
storing the second portion in the storage device;
determining a first result from decoding the first portion using the first error correction code;
determining a second result from decoding the first portion using the second error correction code;
comparing the first result and the second result;
determining, based on comparing the first result and the second result, a failure to decode the first portion; and
in response to determining the failure to decode the first portion, sending the second portion to the host system for decoding using the second error correction code.

* * * * *